United States Patent [19]

Failes et al.

[11] Patent Number: 4,622,460
[45] Date of Patent: Nov. 11, 1986

[54] FIBRE OPTIC MAGNETIC SENSOR

[75] Inventors: Michael Failes, Moffat; Pantazis Mouroulis, Mississaugua, both of Canada

[73] Assignee: Her Majesty the Queen in right of Canada, as represented by the Minister of National Defence of Her Majesty's Canadian Government, Ottawa, Canada

[21] Appl. No.: 766,369

[22] Filed: Aug. 16, 1985

[30] Foreign Application Priority Data

Nov. 13, 1984 [CA] Canada ................................. 467697

[51] Int. Cl.⁴ .............................................. H01J 5/16
[52] U.S. Cl. .................................. 250/227; 250/231 R; 324/96
[58] Field of Search .......................... 250/227, 231 R; 324/244, 96

[56] References Cited

U.S. PATENT DOCUMENTS 4,240,066 12/1980 Lenox .................................. 250/227
4,379,226 4/1983 Sichling et al. ................. 250/231 R
4,384,253 5/1983 Förster ................................ 324/244

Primary Examiner—David C. Nelms
Assistant Examiner—L. W. Madoo
Attorney, Agent, or Firm—Sheldon Kanars; Jeremiah G. Murray; Edward Goldberg

[57] ABSTRACT

A fibre optic magnetic sensor is disclosed. The sensor has a thin-walled cylindrical barrel with a mid-section which is elastically radially deformable. A single mode optical fibre is wound about the mid section of the barrel. A magnetostrictive element is located within the center of the barrel and secured to both ends of the barrel. Changes in the external magnetic field in the vicinity of the sensor cause changes in the length of the magnetostrictive element and consequently cause axial forces to be applied to the end of the barrel. The mid-portion of the barrel deforms radially, thus inducing a strain in the optical fibre from which the external magnetic field strength may be deduced.

17 Claims, 1 Drawing Figure

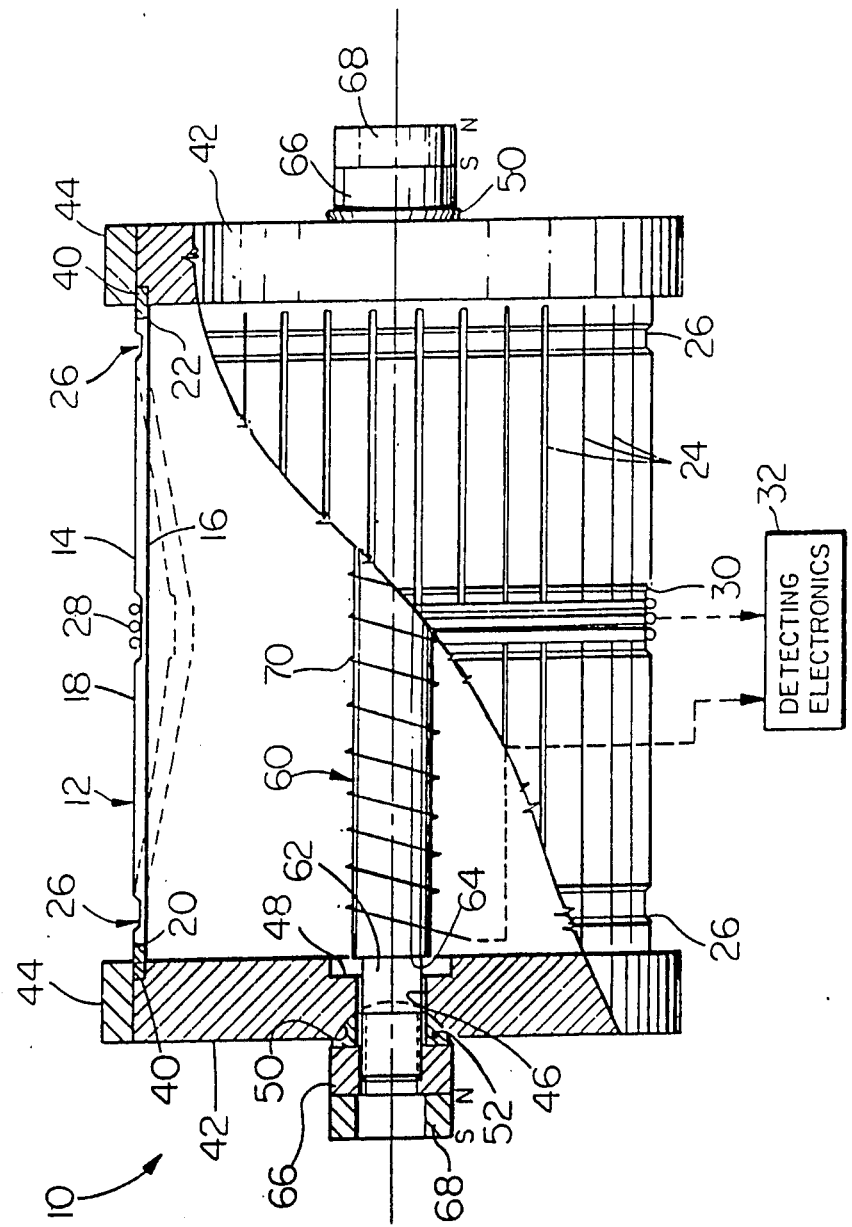

FIBRE OPTIC MAGNETIC SENSOR

BACKGROUND OF THE INVENTION

1. Field of the Invention

The present invention relates generally to a fibre optic magnetic sensor or transducer and specifically to a magnetic transducer of the type which utilizes the magnetostrictive properties of metal alloys.

2. Description of the Prior Art

The possibility of sensing magnetic fields by the use of optical fibres has long been recognized and several types of fibre optic magnetic sensors have been developed. The most successful and sensitive devices utilize the magnetostrictive properties of metal alloys.

Magnetostriction is defined as the change in dimension of a ferromagnetic material when it is placed along the axis of an applied magnetic field. The magnetostriction may be positive (expansion) or negative (contraction) depending on the material and/or its composition. For example, pure nickel displays negative magnetostriction whereas iron-nickel alloys having less than 45% nickel display positive magnetostriction. In fibre optic magnetic sensors, a single mode optical fibre is bonded to or sheathed by a magnetostrictive jacket that undergoes a longitudinal strain when immersed in a magnetic field. This strain is transmitted to the optical fibre and affects the phase delay of a laser light beam propagating through the fibre. Provided the magnetic field is of sufficient strength, the phase changes can be detected using currently available technology and the strength of the field can be determined. The difficulty heretofore has been the provision of a relatively simple and inexpensive sensor of the type described which is capable of sensing very weak magnetic fields, that is fields in the order of $10^{-5}$ and $10^{-8}$ Gauss.

As suggested above, nickel and amorphous iron alloys have been found to be particularly suitable for use in fibre optic magnetic sensors. Amorphous alloys possess large magnetostriction but are available only in very thin (0.001 inch) strips and, thus, their versatility is rather limited. Bulk nickel transducers, on the other hand, can be configured in a variety of shapes with relative ease. However, they possess smaller magnetostriction which renders them somewhat insensitive for detecting weak magnetic fields of the magnitude in question. A further drawback of conventional optic fibre magnetic transducers is their susceptibility to and inability to be compensated for thermal effects, it being well known that thermal effects can easily swamp magnetic signals of the magnitude of interest.

SUMMARY OF THE INVENTION

It is an object of the present invention to provide a fibre optic magnetic sensor capable of sensing weak magnetic fields.

It is another object of the present invention to provide a fibre optic magnetic sensor which amplifies the magnetostrictive properties of a material.

A further object of the present invention is to provide a fibre optic magnetic sensor which is capable of being thermally and magnetically compensated.

The present invention features a cylindrical barrel which has an elastically radially deformable mid-section. Longitudinal slots may be cut into the barrel to increase its deformability. A single mode optical fibre is wound under tension around the mid-section of the barrel. End plates are attached to both ends of the barrel. A core of magnetostrictive material, such as pure nickel, is located within the barrel, aligned with the central axis of the barrel, and attached to both end plates. When the device is placed in an external magnetic field, the magnetic field causes the magnetostrictive core to expand or contract. The magnetostrictive core causes the two end plates to move toward or away from each other. Movement of the end plates causes radial deformation inward or outward of the mid-section of the barrel. A small expansion or contraction of the magnetostrictive core causes a substantially greater radial deformation of the mid-section of the barrel. Thus, the magnetostrictive properties of the core are amplified. The radial deformation of the barrel causes strains in the optical fibres. The strains in the fibres can be measured by conventional means, and the external magnetic field strength deduced.

These and other features of the invention will become more apparent from the following description in which reference is made to the appended drawing.

BRIEF DESCRIPTION OF THE DRAWING

The FIGURE is a partially broken, side elevational view of the fibre optic magnetic sensor of the present invention.

DESCRIPTION OF THE PREFERRED EMBODIMENT

With reference to the FIGURE, the fibre optic magnetic sensor of the present invention, generally designated by reference numeral 10, is comprised of a thin-walled cylindrical shell or barrel 12. In a preferred embodiment of the present invention, the barrel has a length of about 4½ inches, a wall thickness of about 0.030 inch, and a diameter of about 3¼ inches. The barrel includes an outer surface 14, an inner surface 16 and a central portion 18 intermediate opposed ends 20 and 22.

The central portion of the barrel 12 is elastically, radially deformable for reasons which will become clearer later. To that end, the barrel is formed with 45 equally circumferentially spaced, longitudinal slots 24 to permit the barrel to deflect radially inwardly or outwardly and to impart longitudinal elasticity or resilience to the barrel. A circumferential groove 26, having a depth of about 0.025 inch, in a preferred embodiment, may be provided adjacent each end of the barrel as is shown in order to reduce the resistance of the barrel to flexing. A single mode optical fibre 28 is wound under tension within a circumferential, centrally disposed groove 30 formed in the mid or central portion of the outer surface of the barrel 12.

The optical fibre 28 is adapted in a known manner to be connected to a suitable conventional apparatus, generally designated by reference numeral 32, for applying a laser light beam to the fibre and detecting changes in the light propagating properties of the fibre. Such apparatus forms no part of the present invention and thus has not been described in detail herein.

Each end of barrel 12 is secured in a seat 40 of a disc-shaped, end plate 42 by means of a clamp ring 44. In addition to supporting the barrel 12, the end plates 42 serve to transmit axial forces to the ends of the barrel 12 in the manner explained below. Each end plate 42 is formed with a concentric through bore 46. The inner end of the bore is countersunk to define an annular shoulder 48 while the outer end of the bore terminates in a concentric recessed, spherical seat 50 arranged to receive a spherical washer 52.

A core 60 is concentrically disposed within the barrel and secured to the end plates. The core is formed of a magnetostrictive material, preferably nickel, a material which, in a substantially pure form, displays negative magnetostriction (contracting dimensions). The core 60 is cylindrical and is formed with reduced diameter end portions 62 which define shoulders 64 and which are threaded for engagement with brass nuts 66. Each reduced diameter end portion 62 is dimensioned to extend through bore 46 in each one of the end plates 42, receive a spherical washer 52, and threadedly receive a brass nut 66.

Thus secured, the core 60 permits the end plates 42 to move axially toward and away from one another between predefined limits in response to slight increases and decreases in the length of the core 60 as a result of changes in the intensity of a magnetic field within which the transducer is immersed. The axial forces thus transmitted to the barrel 12 via the end plates 42 cause the midportion of the barrel 12 to deform radially inwardly or outwardly and thereby induce in the optical fibre 28 a magnetic field strength related strain. It can be shown that a small deformation of the core 60 results in a much greater radial deformation of the barrel 12. Accordingly, it will be seen that the above described arrangement amplifies the magnetostrictive properties of the material of the core 60. It can be shown that gain factors of up to 50 can be obtained by this arrangement.

Two permanent magnets 68 provide part of a bias field necessary to sensitize the core. A coil 70 wound about the core may be included in order to provide a dynamic means of changing the field and cancelling changes due to variations in an external field. However, inasmuch as a coil would cause local heating and may induce thermal instability in the transducer, it is preferred to cancel changes due to external fields by modulation of the wavelength of the laser light source.

An additional feature of the transducer of the present invention is its capability of being thermally compensated by the judicious selection of materials. Thermal compensation is important inasmuch as thermal effects could easily swamp magnetic signals. Thermal compensation can be achieved by forming at least the barrel and endplates of a non-magnetic material having a thermal expansion coefficient approximately equal to that of the core so that stress relief due to fibre expansion will tend to cancel effects due to transducer expansion.

In the initial set-up of the transducer, nuts 66 are positioned so that the midportion of the barrel is slightly deformed radially inwardly as shown in phantom lines in the drawing. The optical fibre 28 is then wound about the central groove 30 of the barrel and connected to conventional electronic apparatus 32. The nuts 66 are then adjusted to prestress the optical fibre and determine the gain factor of the transducer.

In operation, when the transducer is immersed in a magnetic field of interest, the length of the core will decrease in proportion to the strength of the magnetic field by virtue of the negative magnetostrictive properties of the nickel core. The reduction in length will result in the transmission of inwardly directed axial forces to the barrel by means of nuts 66, washers 52 and end plates 42. This in turn will cause the barrel to elastically compress slightly and the midportion thereof to flex radially inwardly. As a consequence, the length and strain of the optical fibre will be reduced and its light propagating properties will be altered. Should the field be removed or its strength abate, the reverse will occur. The core will elongate slightly and reduce the axial inward forces applied to the barrel. By virtue of its longitudinal resilience, the barrel will force the end plates apart causing its midportion to expand radially to thereby increase the length of and strain within the fibre.

It will be seen therefore that the above described structure provides an arrangement for amplifying the magnetostrictive properties of the core and therefore the sensitivity of the sensor. While the device has been described with reference to a material which displays negative magnetostriction, it will be appreciated that the invention is equally applicable to materials which display positive magnetostriction.

It will also be understood that the dimensions and quantities given above are for illustrative purposes only and are not to be considered as delimiting the invention. Indeed, the transducer can be scaled to any size, the only constraint being the length of fibre it can accommodate if made too small.

The illustrative embodiments herein are merely a few of those possible variations which will occur to those skilled in the art while using the inventive principles contained herein. Accordingly, numerous variations of the invention are possible while staying within the spirit and scope of the invention as defined in the following claims.

What is claimed is:

1. A fibre optic magnetic sensor, comprising:
    a thin-walled barrel having an elastically, radially deformable central portion intermediate opposed ends;
    a single mode optical fibre wound about said central portion of said barrel;
    an actuating element having a longitudinal dimension and being formed of a magnetostrictive material such that changes in the magnitude of a magnetic field within which said element is immersed result in changes in the length of said dimension;
    means connecting said barrel to said actuating element so that changes in said dimension are transmitted axially to said barrel and result in radial deformation of said central portion of said barrel and a magnetic field strength related strain in said optical fibre; and
    means for producing a bias magnetic field within said barrel.

2. A fibre optic magnetic sensor as defined in claim 1, wherein said barrel is formed of non-magnetic material.

3. A fibre optic magnetic sensor as defined in claim 1, wherein said connecting means is formed of non-magnetic material.

4. A fibre optic magnetic sensor as defined in claim 1, wherein said barrel and said connecting means are formed of non-magnetic material.

5. A fibre optic magnetic sensor as defined in claim 2, said non-magnetic material having a thermal coefficient which is approximately equal to that of said magnetostrictive material.

6. A fibre optic magnetic sensor as defined in claim 3, said non-magnetic material having a thermal coefficient which is approximately equal to that of said magnetostrictive material.

7. A fibre optic magnetic sensor as defined in claim 4, said non-magnetic material having a thermal coefficient which is approximately equal to that of said magnetostrictive material.

8. A fibre optic magnetic sensor as defined in claim 1, said barrel having a circumferential groove in said central portion for receiving said optical fibre, said fibre being wound under tension within said groove so that said radial deformation changes the strain in said fibre, and means for detecting said change in strain and for measuring the related magnetic field strength.

9. A fibre optic magnetic sensor as defined in claim 1, said barrel having a plurality of equally circumferentially spaced, longitudinally slots extending through the thickness thereof for permitting radial flexing of said central portion of said barrel.

10. A fibre optic magnetic sensor as defined in claim 1, said barrel having a circumferential groove adjacent each end thereof for reducing the resistance to radial flexing of said barrel.

11. A fibre optic magnetic sensor as defined in claim 1, said barrel having a circumferential groove in the central portion thereof for receiving said optical fibre, a plurality of equally circumferentially spaced, longitudinal slots extending through the thickness thereof for permitting radial flexing of said central portion of said barrel and imparting longitudinal resilience to said barrel, and a circumferential groove adjacent each end thereof for reducing the resistance to radial flexing of said barrel.

12. A fibre optic magnetic sensor as defined in claim 1, said actuating element being an elongated core concentrically disposed within said barrel and said connecting means including plate means mounted on each end of said core, each said plate means being secured to one end of said barrel, and means for selectively adjustably positioning at least one of said plate means on said core.

13. A fibre optic magnetic sensor as defined in claim 1, said means for producing a bias magnetic field within said barrel including a permanent magnet secured to said sensor.

14. A fibre optic magnetic sensor as defined in claim 1, wherein said actuating element includes a central longitudinal core concentrically supported within said barrel, and said means for producing a bias magnetic field within said barrel includes a coil wound about said core.

15. A fibre optic magnetic sensor as defined in claim 12, said core being made of nickel and said connecting means being formed of aluminum.

16. A fibre optic magnetic sensor, comprising:
a cylindrical barrel formed of non-magnetic material and having a central portion arranged to receive a multiplicity of windings of an optical fibre, said central portion of said barrel being radially resiliently inwardly and outwardly deformable;
means for supporting the opposite ends of said barrel and applying axial forces to said barrel;
a core formed of substantially pure nickel concentrically disposed within said barrel and secured to said means for supporting the opposite ends of said barrel;
an electrical conductor wound about said core for producing a time-varying magnetic field along said core upon application of a time-varying current to said conductor to selectively cancel changes in external magnetic field variations; and
a permanet magnet secured to each end of said core for providing a bias magnetic field for sensitizing said core.

17. A fibre optic magnetic sensor, comprising:
a cylindrical nickel core having a main body portion and threaded end portions of lesser diameter than said main body portion and defining an annular shoulder, said end portions being adapted to threadedly receive a nut thereon;
a disc-shaped end plate formed of non-magnetic material concentrically mounted on each end of said core, each said end plate having an inner surface and an outer surface, a through bore for receiving one of said end portions, an annular concentric groove adjacent the outer periphery of said inner surface, and a concentric spherical seat in said outer surface, a spherical washer receivable in said seat, a nut threaded onto its associated end portion against said washer, said inner surfaces of said end plates being abuttingly engageable with said shoulders for limiting axial inward movement of said end plates;
a permanet magnet secured to each said nut for providing a bias magnetic field for sensitizing said core;
an electrical conductor wound about said core for producing a time-varying magnetic field along said core upon application of a time-varying current to said conductor for selectively cancelling changes in external magnetic field variations;
a cylindrical barrel formed of non-magnetic material and having an outer cylindrical surface and a concentric inner cylindrical surface defining a relatively thin barrel wall of predetermined thickness, and opposed ends, said barrel having a circumferential groove in the midportion of said outer surface for receiving an optical fibre, a plurality of equally circumferentially spaced longitudinal slots extending through the thickness thereof for permitting said midportion of said barrel to flex radially, and a circumferential groove adjacent each end of said barrel for reducing the resistance to radial flexing of said barrel; and
an optical fibre wound in said central circumferential groove of said barrel.

* * * * *